United States Patent [19]
Essaff

[11] Patent Number: 4,998,148
[45] Date of Patent: Mar. 5, 1991

[54] SCHOTTKY DIODE HAVING INJECTED CURRENT COLLECTOR

[76] Inventor: Robert Essaff, 721 Wasatch Dr., Fremont, Calif. 94536

[21] Appl. No.: 425,433

[22] Filed: Oct. 20, 1989

Related U.S. Application Data

[63] Continuation of Ser. No. 81,830, Aug. 5, 1987, abandoned.

[51] Int. Cl.$^5$ ............................................ H01L 29/48
[52] U.S. Cl. ........................................ 357/15; 357/55; 357/68
[58] Field of Search ............................... 357/15, 55, 68

[56] References Cited

U.S. PATENT DOCUMENTS 4,007,270  8/1980  Iesaka ...................................... 357/15
4,618,871  10/1986  Mitlehner ............................... 357/15

*Primary Examiner*—Edward J. Wojciechowicz

[57] ABSTRACT

A Schottky diode structure is provided with a current collector ring surrounding the diode structure thereby collecting current injected from the diode structure which otherwise would flow into the substrate.

8 Claims, 1 Drawing Sheet

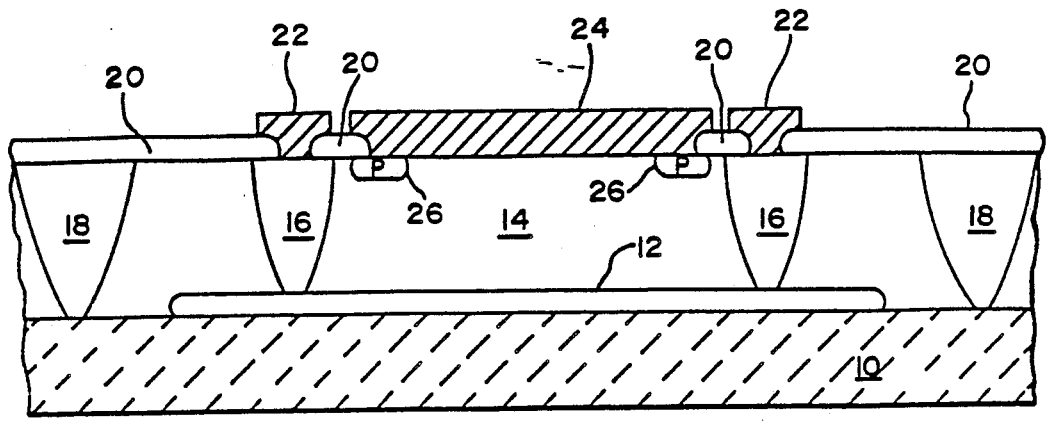
(PRIOR ART)
FIG.—1
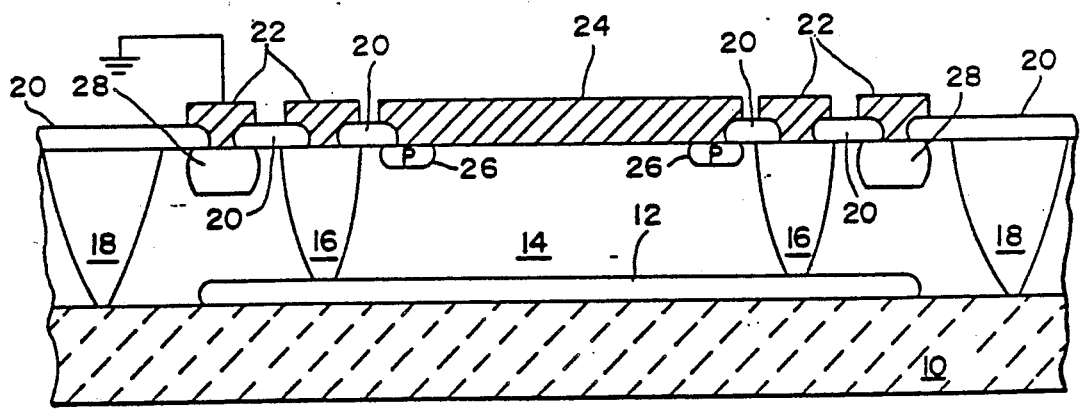
(PRIOR ART)
FIG.—2

SCHOTTKY DIODE HAVING INJECTED CURRENT COLLECTOR

This is a continuation of application Ser. No. 081,830 filed Aug. 5, 1987 now abandoned.

BACKGROUND OF THE INVENTION

This invention relates generally to Schottky diodes, and more particularly the invention relates to a Schottky diode structure which improves operating characteristics of surrounding circuitry.

The Schottky diode is formed at the boundary of a metal in contact with a doped semiconductor material. In an epitaxial structure, the metal contacts the surface of an epitaxial layer formed on a supporting substrate. A highly-doped buried layer is normally formed on the surface of an opposite-conductivity-type substrate prior to the formation of the epitaxial layer. The epitaxial layer will have the same conductive type as the buried layer, and the buried layer becomes the anode or cathode of the diode.

One problem in operating a conventional Schottky diode in a substrate having other electrical components thereon arises from diode current being injected into the substrate. The injected current can have deleterious effects on the other electrical components.

SUMMARY OF THE INVENTION

An object of the invention is an improved Schottky diode structure.

Another object of the invention is a reduction in current injected into the substrate of a Schottky diode structure.

Briefly, in accordance with the invention, a current collection ring is provided around a Schottky diode and is suitably biased to collect current that otherwise would escape from the diode and flow to the substrate. More particularly, the ring is biased more negative than the anode of the diode, thereby ensuring a return path for carriers that otherwise would be injected into the substrate and affect other circuit components on the substrate.

The invention and objects and features thereof will be more readily apparent from the following detailed description and appended claims.

BRIEF DESCRIPTION OF THE DRAWING

FIG. 1 is a sectional view of a conventional Schottky diode.

FIG. 2 is a sectional view of a Schottky diode having a current collector ring in accordance with the invention.

DETAILED DESCRIPTION

FIG. 1 is a section view of a conventional Schottky diode structure. In this embodiment, the structure comprises a supporting p-type substrate 10 on which is formed an n+ buried layer 12 and an n-type epitaxial layer 14. Diffused n+ contacts 16 extend from the surface of the epitaxial layer 14 to contact the buried layer 12. Oxide isolation 18 surrounds the device structure and extends from the surface of the epitaxial layer to the substrate 10. Field oxide 20 is formed on the surface of the epitaxial layer 14, and metal contacts 22 are made through openings in the oxide 20 to the n+ regions 16. A square or circular metal layer 24 forms the anode of the Schottky diode, and the n region 14 and the buried layer 12 form the cathode of the diode. A p-doped guard ring 26 can be provided around the periphery of metal layer 24 to improve electrical characteristics, but this ring is not essential.

Heretofore, some of the current passing through the Schottky diode has been injected into the p-type substrate 10 due to the PNP bipolar transistor action of the structure. As described above, the injected current can affect the operation of circuit components formed on the substrate 10 around the Schottky diode.

In accordance with the present invention, a current collector ring is provided around the Schottky diode inside of the device structure and is suitably biased to collect current that otherwise would be injected into the substance during conducting of the Schottky diode. This is illustrated in FIG. 2 which shows a structure similar to the structure of FIG. 1 with the addition of a diffused p-type ring 28 formed in the surface of the epitaxial layer within the device region defined by the oxide isolation 18 and outside of the contacts 16 to the buried layer 12. In this embodiment, the collection ring 28 is grounded and thereby drains off injected current from the Schottky diode. Thus, the PNP transistor action of the anode 24, epitaxial layer 14 and the collection ring 28 overrides the PNP transistor action of the anode 24, epitaxial layer 14 and substrate 10. Accordingly, current injected into the substrate is reduced, thereby improving operation of circuit components adjacent to the Schottky diode.

While the invention has been described with reference to a specific embodiment, the description is illustrative of the invention and not to be construed as limiting the invention. Various modifications and applications may occur to those skilled in the art without departing from the true spirit and scope of the invention as defined by the appended claims.

What is claimed is:

1. A Schottky diode structure comprising a semiconductor body including a substrate of one conductivity type and an epitaxial layer of opposite conductivity type, said epitaxial layer having a first major surface,
   a metal layer formed on said surface in contact with said body and forming a Schottky barrier therebetween,
   means for contacting said metal layer as one contact of said Schottky diode structure,
   a current collector region of said one conductivity at said surface spaced from and surrounding said metal layer, said current collection region being electrically isolated from said metal layer and connectable to a circuit voltage potential to drain off current injected from said Schottky diode structure that otherwise would be injected into said substrate.

2. The Schottky diode structure as defined by claim 1 and further including a buried layer of said opposite conductivity type between said epitaxial layer and said substrate.

3. The Schottky diode structure as defined by claim 2 and further including a doped conductive path of said opposite conductivity type extending from said surface to said buried layer, said means for contacting said semiconductor body contacting said doped conductive path, said current collector region surrounding said doped conductive path.

4. The Schottky diode structure as defined by claim 3 and further including an oxide isolation region extending from said surface to said substrate and surrounding said current collector region.

5. The Schottky diode structure as defined by claim 3 wherein said one conductivity type is p-type, and said opposite conductivity type is n-type.

6. The Schottky diode structure as defined by claim 5 wherein said circuit voltage potential is ground.

7. The Schottky diode structure as defined by claim 1 and further including a doped ring of said one conductivity type in said epitaxial layer under the periphery of said metal layer.

8. The Schottky diode structure as defined by claim 1 wherein said circuit voltage potential is ground.

* * * * *

UNITED STATES PATENT AND TRADEMARK OFFICE
CERTIFICATE OF CORRECTION

PATENT NO. : 4,998,148

DATED : March 5, 1991

INVENTOR(S) : Robert Essaff

It is certified that error appears in the above-identified patent and that said Letters Patent is hereby corrected as shown below:

On the Title Page, insert the following:

-- [73] Assignee: Linear Technology Corporation, Milpitas, California --

Signed and Sealed this

Eighth Day of September, 1992

Attest:

DOUGLAS B. COMER

*Attesting Officer*  *Acting Commissioner of Patents and Trademarks*